United States Patent
Kim et al.

(10) Patent No.: US 11,215,450 B2
(45) Date of Patent: Jan. 4, 2022

(54) METHOD OF MEASURING THICKNESS OF A ULTRA-THIN FILM

(71) Applicant: KOREA RESEARCH INSTITUE OF STANDARDS AND SCIENCE, Daejeon (KR)

(72) Inventors: Kyung Joong Kim, Daejeon (KR); Tae Gun Kim, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 0 days.

(21) Appl. No.: 17/084,427

(22) Filed: Oct. 29, 2020

(65) Prior Publication Data
US 2021/0131802 A1   May 6, 2021

(30) Foreign Application Priority Data
Oct. 31, 2019   (KR) .......................... 10-2019-0137233

(51) Int. Cl.
*G12B 13/00*   (2006.01)
*G01B 15/02*   (2006.01)

(52) U.S. Cl.
CPC .................................. *G01B 15/025* (2013.01)

(58) Field of Classification Search
CPC ................ G01B 15/025; G01B 21/042; G01B 2210/56; G01B 15/02; G01B 11/06; H01L 22/00; H01L 22/12; H01L 22/20
See application file for complete search history.

(56) References Cited

U.S. PATENT DOCUMENTS

2006/0064193 A1 *   3/2006   Yamashita ............. H01L 22/20
                                                        700/121

FOREIGN PATENT DOCUMENTS

KR   10-2010-0078097 A   7/2010

OTHER PUBLICATIONS

Primetzhofer et al., Ultra-thin film and interface analysis of high-k dielectric materials employing time-of-flight medium energy ion scattering (TOF-MEIS), Nuclear Instruments and Methods in Physics Research B, vol. 332, pp. 212-215 (Year: 2014).*
T. J. Shaffner, "Semiconductor characterization and analytical technology," Proceedings of the IEEE, vol. 88, No. 9, pp. 1416-1437. (Year: 2000).*
Butterfield et al., "Structure of ultrathin films of Co on Cu(111) from normal-incidence x-ray standing wave and medium-energy ion scattering measurements," Physical Review B, vol. 62, No. 24, pp. 16984-16994. (Year: 2000).*
Sayan et al., "Chemical vapor deposition of HfO2 films on Si(100)," Journal of Vacuum Science & Technologies A, vol. 20, No. 2, pp. 507-512. (Year: 2002).*

(Continued)

*Primary Examiner* — Kiho Kim
(74) *Attorney, Agent, or Firm* — Knobbe Martens Olson & Bear LLP

(57) ABSTRACT

Disclosed is a method of calculating a thickness of an ultra-thin film having a nm-order thickness based on measuring a thickness of each of ultra-thin films having different thicknesses by using a first thickness measurement method with length-unit traceability and separately measuring the thickness of each of the ultra-thin films having different thicknesses by using a second thickness measurement method with offset traceability.

6 Claims, 5 Drawing Sheets

(56) References Cited

OTHER PUBLICATIONS

Kim, "Absolute Thickness Measurement of nm Oxide Films by XPS and Length Unit Traceable Method", CCQM Workshop on Advances in Metrology in Chemistry and Biology—38 pages (Apr. 10, 2019).
Kim et al., "Measurement of absolute thickness of nm oxide films by MEIS", ALC '19-57 pages (Oct. 23, 2019).

* cited by examiner

METHOD OF MEASURING THICKNESS OF A ULTRA-THIN FILM

CROSS-REFERENCE TO RELATED APPLICATIONS

This application claims priority under 35 U.S.C. § 119 to Korean Patent Application No. 10-2019-0137233, filed on Oct. 31, 2019, in the Korean Intellectual Property Office, the disclosure of which is incorporated herein by reference in its entirety.

TECHNICAL FIELD

The following disclosure relates to a method of calculating a thickness of an ultra-thin film, and a calibration standard used in calculating the thickness of the ultra-thin film.

BACKGROUND

A gate insulating film is a thin film with an insulation property and serves to adjust movement of electrons in a semiconductor device. In the early days of the semiconductor industry, a silicon oxide film ($SiO_2$) was mainly used as the gate insulating film. However, recently, a high-k material with a very high dielectric constant, such as a silicon oxynitride film (SiON) or a hafnium oxide film ($HfO_2$) with a high insulation property, has been used. As the size of the semiconductor device decreases, an insulating film having a smaller thickness has been demanded. Particularly, with the recent development of the system semiconductor industry, a technology of accurately measuring a thickness of an ultra-thin insulating film, which is only several nanometers, is one of the most important process analysis issues. Korean Patent Laid-Open Publication No. 10-2010-0078097 discloses the related technology.

The disclosure of this section is to provide background information relating to the invention. Applicant does not admit that any information contained in this section constitutes prior art.

SUMMARY

An embodiment of the present invention is directed to providing a method capable of accurately measuring a thickness of an ultra-thin film in a range of nm-scale thickness that may not be accurately measured with a single measurement technology.

A calibration standard according to embodiments of the present invention is a graph type calibration standard used for calibration when calculating a thickness of an ultra-thin film having a nm-order thickness and is based on measurement values obtained by measuring thicknesses of ultra-thin films having different thicknesses in reference samples including the ultra-thin films to be measured, the measurement values include a first measurement value using a first thickness measurement method with length-unit traceability and a second measurement value using a second thickness measurement method with offset traceability, and the graph type calibration standard includes a linear mutual calibration graph having a slope m and a y-intercept c, obtained by performing linear fitting of points having the first measurement value as a y-axis value and the second measurement value as an x-axis value.

In the calibration standard according to an embodiment of the present invention, the first thickness measurement method may be a thickness measurement method using a high-resolution transmission electron microscope (HR-TEM), and the second thickness measurement method may be a thickness measurement method using medium energy ion scattering spectrometry (MEIS).

Embodiments of the present invention provide a method of calculating a thickness of an ultra-thin film having a nm-order thickness using the above-described calibration standard.

The method of calculating a thickness according to embodiments of the present invention is a method of calculating a thickness of an ultra-thin film having a nm-order thickness, the method including: a) measuring a thickness of each of ultra-thin films having different thicknesses by using a first thickness measurement method with length-unit traceability to obtain a first measurement value, and separately measuring the thickness of each of the ultra-thin films having different thicknesses by using a second thickness measurement method with offset traceability to obtain a second measurement value; b) obtaining a mutual calibration graph having a slope m and a y-intercept c by performing linear fitting of points specified by the first measurement value and the second measurement value of each of the ultra-thin films having different thicknesses on a y axis representing a thickness obtained by the first thickness measurement method and an x axis representing a thickness obtained by the second thickness measurement method; and c) obtaining a first calibrated thickness by subtracting the y-intercept c from the first measurement value, obtaining a second calibrated thickness by multiplying the second measurement value by the slope m, and calculating an average value of the first calibrated thickness and the second calibrated thickness.

In the method of calculating a thickness according to an embodiment of the present invention, the first thickness measurement method may be a thickness measurement method using the high-resolution transmission electron microscope (HR-TEM), and the second thickness measurement method may be a thickness measurement method using the medium energy ion scattering spectrometry (MEIS).

In the method of calculating a thickness according to an embodiment of the present invention, the ultra-thin film in a) may be formed on a silicon single crystal substrate.

In the method of calculating a thickness according to an embodiment of the present invention, when measuring the thickness by using the high-resolution transmission electron microscope, the thickness of the ultra-thin film may be measured based on an inter-planar spacing of a silicon single crystal.

In the method of calculating a thickness according to an embodiment of the present invention, when measuring the thickness by using the high-resolution transmission electron microscope, the first measurement value which is the thickness of the ultra-thin film may be calculated by obtaining contrast intensity distribution with respect to a virtual line that crosses from the silicon single crystal to the ultra-thin film while being perpendicular to a surface of the silicon single crystal substrate in a vertical cross-sectional high-resolution transmission electron microscope image of a layered body of the silicon single crystal substrate and the ultra-thin film, calculating an average contrast intensity of each of two regions forming boundaries in the contrast intensity distribution, and determining a central point of two average contrast intensities as a position of an interface between two regions.

In the method of calculating a thickness according to an embodiment of the present invention, when measuring the thickness by using the medium energy ion scattering spectrometry (MEIS), a ratio of thin film signal intensity ($I_B$)/substrate signal intensity ($I_A$), which is the second measurement value, may be calculated by obtaining the substrate signal intensity ($I_A$) by integrating a signal intensity in a specific section of an energy interval corresponding to silicon in a medium energy ion scattering spectrum, and by obtaining the thin film signal intensity ($I_B$) by integrating a signal intensity in the entire energy interval corresponding to component elements of the ultra-thin film in the same spectrum.

Other features and aspects will be apparent from the following detailed description, the drawings, and the claims.

DETAILED DESCRIPTION OF EMBODIMENTS

Figure 1:
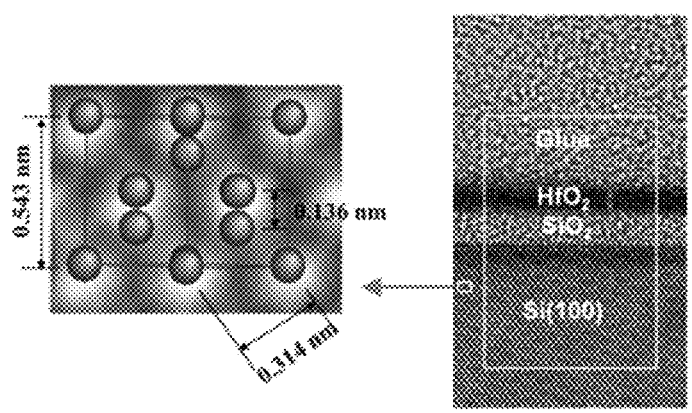
FIG. 1 is a diagram illustrating an example of using a silicon single crystal as a basis when measuring a thickness of an ultra-thin film by using a high-resolution transmission electron microscope.

Hereinafter, a method of calculating a thickness according to embodiments of the present invention will be described in detail with reference to the accompanying drawings. The drawings to be provided below are provided by way of example so that the idea of the present invention can be sufficiently transferred to those skilled in the art to which the present invention pertains. Therefore, the present invention is not be limited to the drawings provided below but may be modified in many different forms. In addition, the drawings suggested below will be exaggerated in order to clearly describe the spirit and scope of the present invention. Technical terms and scientific terms used in the present specification have the general meaning understood by those skilled in the art to which the present invention pertains unless otherwise defined, and a description for the known function and configuration obscuring the present invention will be omitted in the following description and the accompanying drawings. Further, singular forms used in the specification and the appended claims may be intended to include plural forms, unless the context indicates otherwise. For example, the unit of percentage (%) or ratio means wt % or weight ratio.

A method of calculating a thickness according to the present disclosure is a method of calculating a thickness of an ultra-thin film having a nm-order thickness, specifically, a thickness of 1 to 9 nm, and more specifically, 1 to 5 nm.

The method of calculating a thickness according to embodiments of the present invention includes: a) measuring a thickness of each of ultra-thin films having different thicknesses by using a first thickness measurement method with length-unit traceability to obtain a first measurement value, and separately measuring the thickness of each of the ultra-thin films having different thicknesses by using a second thickness measurement method with offset traceability to obtain a second measurement value; b) obtaining a mutual calibration graph having a slope m and a y-intercept c by performing linear fitting of points specified by the first measurement value and the second measurement value of each of the ultra-thin films having different thicknesses on a y axis representing a thickness obtained by the first thickness measurement method and an x axis representing a thickness obtained by the second thickness measurement method; and c) obtaining a first calibrated thickness by subtracting the y-intercept c from the first measurement value, obtaining a second calibrated thickness by multiplying the second measurement value by the slope m, and calculating an average value of the first calibrated thickness and the second calibrated thickness.

In embodiments of the present invention, a length-unit traceable thickness measurement method refers to a method in which a thickness of a thin film is determined based on a basic unit (m) of a physical length. As an example, in the length-unit traceable thickness measurement method, thickness measurement may be performed by using a high-resolution transmission electron microscope (HR-TEM). The length-unit traceable thickness measurement method may be a thickness measurement method using the HR-TEM, in which a thickness is determined based on a lattice constant of single-crystal silicon. In the thickness measurement using the HR-TEM, a substrate of an ultra-thin film may be single-crystal silicon, and the thickness of the ultra-thin film may be determined based on a lattice constant of the single-crystal silicon. Particularly, the measurement using the HR-TEM is free from an influence of (is not affected by) a surface oxide film, which is advantageous.

In the present disclosure, an offset traceable thickness measurement method refers to a thickness measurement method in which when an actual thickness of a thin film becomes 0, a measurement thickness becomes 0. For example, the offset traceable thickness measurement method means a method of converting an amount of substance (component) of a thin film into a thickness. As a specific example, the offset traceable thickness measurement method may be a thickness measurement method using medium energy ion scattering spectrometry (MEIS). Unlike other offset traceable thickness measurement methods, the MEIS is free from an influence of a surface oxide film and an influence of a difference in inelastic mean free path, which is advantageous.

As described above, in the method of calculating a thickness according to embodiments of the present invention, an advantage of one measurement method may compensate for a disadvantage of another measurement method by using a thickness measurement result obtained by the offset traceable thickness measurement method and a thickness measurement method obtained by the physical length-unit traceable thickness measurement method, such that an absolute thickness of an ultra-thin film of several nm may be calculated.

In a), the thickness of each of the ultra-thin films having different thicknesses is measured by using the first thickness measurement method with length-unit traceability to obtain the first measurement value, and the thickness of each of the ultra-thin films having different thicknesses is separately measured by using the second thickness measurement method with offset traceability to obtain the second measurement value.

In a), the first measurement value and the second measurement value may be obtained for each of two or more ultra-thin films formed of the same material and having different thicknesses. The number of ultra-thin films for which the first measurement value and the second measurement value are measured in a) may be 2 to 8, specifically, 3 to 6. However, the number of ultra-thin films is not necessarily limited thereto. The thickness of each of the ultra-thin films having different thicknesses may be 10 nm or less, specifically, 5 nm or less.

Accordingly, the first measurement value and the second measurement value may be obtained for each of N ultra-thin films (N is a natural number of 2 to 8) having different thicknesses in a).

In a), the ultra-thin film may be formed on a silicon single crystal substrate. Therefore, when measuring the thickness of the ultra-thin film by using the first thickness measurement method with length-unit traceability, the length may be based on a lattice constant or an inter-planar spacing of the silicon single crystal substrate, that is, single-crystal silicon. A surface of the silicon single crystal substrate on which the ultra-thin film to be measured is formed may be a low index plane such as a crystal plane such as (100), (110), or (111).

As an example, when measuring the thickness by using the HR-TEM, a thickness of an ultra-thin film is measured based on an inter-planar spacing of a silicon single crystal, such that length-unit traceability may be obtained.

In an example in which an ultra-thin film to be measured is a hafnium oxide film, when measuring the thickness of the ultra-thin film by using the HR-TEM, the thickness of the hafnium oxide film may be measured based on a lattice constant (=0.543 nm) which is an inter-planar spacing of {100} planes observed in a <110> direction in a vertical cross-section of a Si (100) substrate as illustrated in FIG. 1.

Further, when measuring the thickness of the ultra-thin film by using the HR-TEM, the first measurement value which is the thickness of the ultra-thin film may be calculated by obtaining contrast intensity distribution with respect to a virtual line that crosses from the silicon single crystal to the ultra-thin film while being perpendicular to the surface of the silicon single crystal substrate in a vertical cross-sectional HR-TEM image of a layered body of the silicon single crystal substrate and the ultra-thin film, calculating an average contrast intensity of each of two regions forming boundaries in the contrast intensity distribution, and determining a central point of two average contrast intensities as a position of an interface between two regions.

Figure 2:
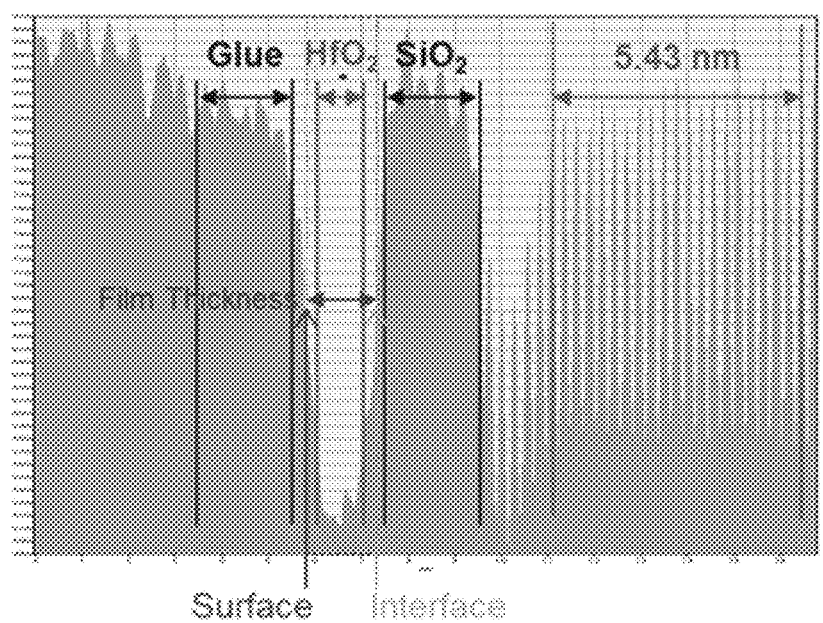
FIG. 2 is a diagram illustrating an example of determining positions of an interface and a surface using an average contrast intensity method when measuring a thickness of an ultra-thin film by using a high-resolution transmission electron microscope.

FIG. 2 is a diagram illustrating contrast intensity distribution with respect to the virtual line that is perpendicular to the silicon (100) in the HR-TEM image of FIG. 1. Average contrast intensities of glue, the hafnium oxide film, and the silicon oxide film may be obtained, and a central point of two average contrast intensities may be defined as the surface or interface. Here, as described above, the first measurement value which is the thickness of the hafnium oxide film may be obtained based on 5.43 nm which is an inter-planar spacing of ten {100} planes.

As described above with reference to FIGS. 1 and 2, in a case of the first thickness measurement method with length-unit traceability, the determined positions of the surface and the interface may be different from actual positions. However, since thickness measurement is performed with the same standard for all ultra-thin films to be measured, the positions of the surface and the interface are determined in the same direction as that of the actual positions, such that the same direction and the same thickness difference, that is, a thickness offset, may be formed. A value of the thickness offset may be calculated by the second thickness measurement method with offset traceability.

In embodiments, image resolution is over than 400,000×, such that a lattice shape of silicon used as a basis when measuring the thickness by using the HR-TEM is clearly observed. In embodiments, the thickness of the ultra-thin film is measured by using an HR-TEM image measured at each of five different positions and obtains an average value of the thicknesses.

In a), the second thickness measurement method with offset traceability is a thickness measurement method in which when an actual thickness of the thin film is 0, a measurement thickness is 0. Since the second thickness measurement method with offset traceability is a method of converting an amount of substance(component) of the thin film into a thickness, in a case where there is no thin film, the thickness is 0.

Figure 3:
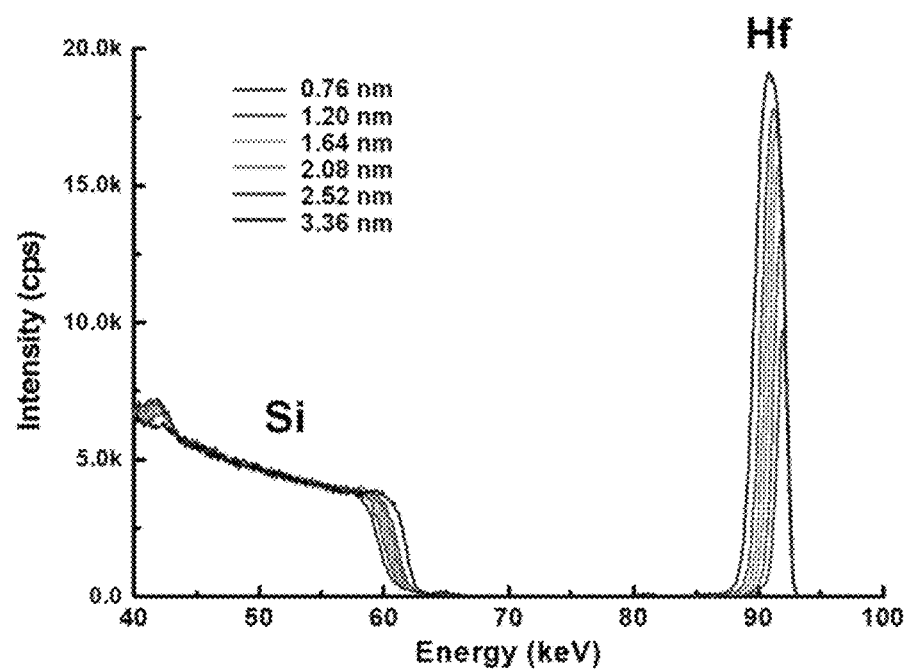
FIG. 3 is a diagram illustrating a medium energy ion scattering spectrum according to a thickness of an ultra-thin film.

In an example in which the ultra-thin film to be measured is a hafnium oxide film, when measuring a thickness using the MEIS which is the second thickness measurement method with offset traceability, as the thickness (3.36, 2.52, 2.08, 1.64, 1.20, and 0.76 nm) of the hafnium oxide film decreases as illustrated in FIG. 3, a peak area of hafnium decreases, and when the thickness of the ultra-thin film becomes 0, the measured thickness approaches 0, and thus the offset traceability is obtained. As discussed, the number of ions scattered after incidence on a surface of a sample is in proportion to the number of component elements in the thin film, and thus it is possible to measure the number of component elements in the thin film, and the thickness may be measured based on an atomic density of the components of the thin film.

When measuring the thickness by using the MEIS, a ratio of thin film signal intensity ($I_B$)/substrate signal intensity ($I_A$), which is the second measurement value, may be calculated by obtaining the substrate signal intensity ($I_A$) by integrating a signal intensity in a specific section of an energy interval corresponding to silicon in a medium energy ion scattering spectrum, and by obtaining the thin film signal intensity ($I_B$) by integrating a signal intensity in the entire energy interval corresponding to the component elements in the ultra-thin film in the same spectrum.

Figure 4:
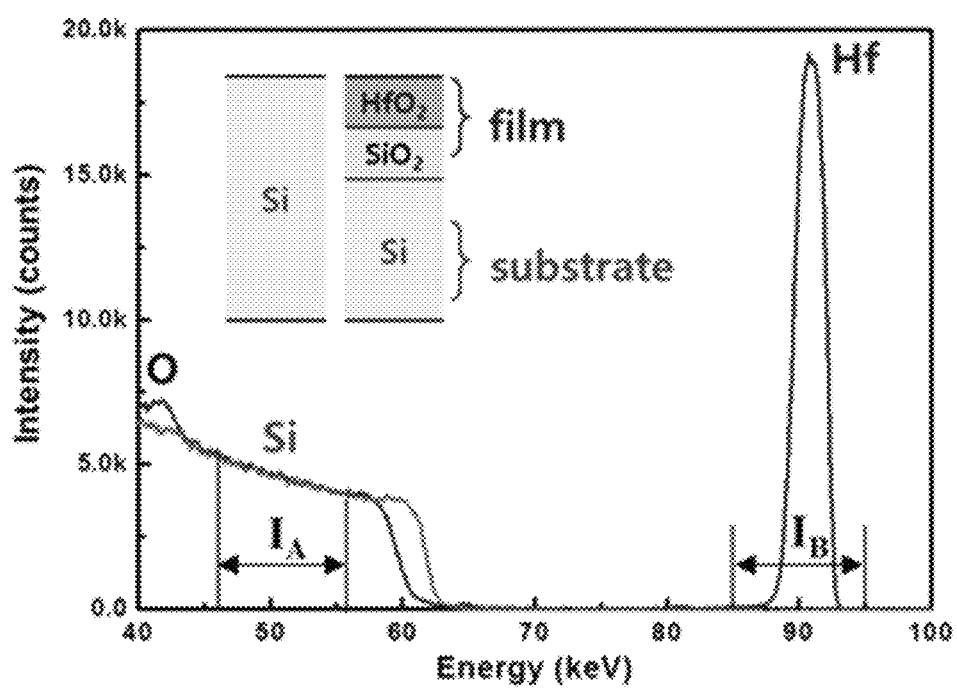
FIG. 4 is a diagram illustrating an example of obtaining a substrate signal intensity and a thin film signal intensity when measuring a thickness of an ultra-thin film by using medium energy ion scattering spectrometry.

As in an example of FIG. 4, the substrate signal intensity ($I_A$) may be obtained by integrating a substrate (silicon) signal intensity in a specific energy interval. In embodiments, the energy interval of the substrate is not the thin film region as illustrated in FIG. 4, and a high energy region(ex. 45 KeV~57 KeV region) that does not include the component elements in the ultra-thin film and is less affected by multiple collision i-s set as the energy interval of the substrate. Here, the same energy interval is applied to all samples. Further, as in the example of FIG. 4, the thin film signal intensity ($I_B$) may be obtained by integrating the entire interval in which a signal intensity of the component elements in the thin film is obtained. Then, the second measurement value which is the intensity ratio ($R_{MEIS}=I_B/I_A$) may be calculated using the substrate signal intensity ($I_A$) and the thin film signal intensity ($I_B$).

In embodiments, when measuring the thickness using the MEIS, obtain a random spectrum is obtained, such that quantitative analysis is not affected by crystallinity of the ultra-thin film to be measured. In a case where the substrate or thin film is a crystal sample, such a random spectrum is generally measured by rotating the sample around a vertical direction of a sample surface, and may be obtained by determining an incidence angle and a scattering angle so that spectra of an amorphous sample and a crystalline sample are measured to be the same. Further, when calculating the intensity ratio which is the second measurement value, in embodiments, an average value of intensity ratios measured at five different positions, respectively, is calculated and taken.

After the first measurement value and the second measurement value of each of the ultra-thin film having different thicknesses are obtained, the mutual calibration graph having the slope m and the y-intercept c may be obtained by performing linear fitting of the points specified by the first measurement value and the second measurement value of each of the ultra-thin films having different thicknesses on the y axis representing a thickness obtained by the first thickness measurement method and the x axis representing a thickness obtained by the second thickness measurement method.

Then, the first calibrated thickness is obtained by subtracting the y-intercept c from the first measurement value, the second calibrated thickness is obtained by multiplying the second measurement value by the slope m, and the average value of the first calibrated thickness and the second calibrated thickness is calculated, such that the actual thickness of the ultra-thin film may be obtained.

Figure 5:
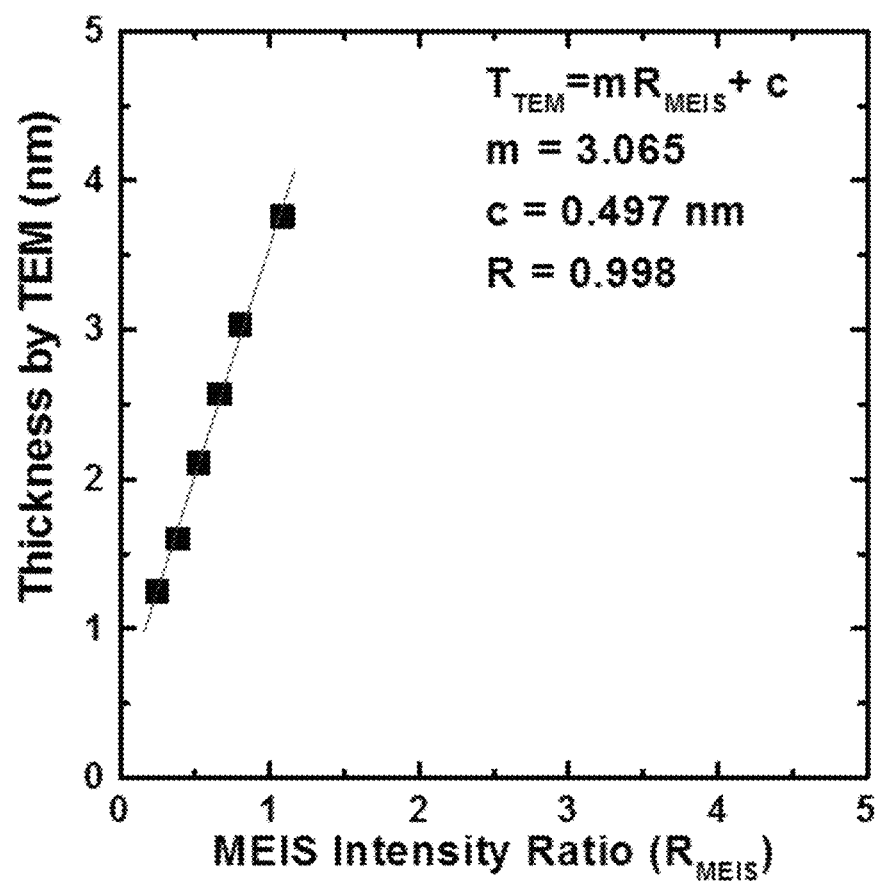
FIG. 5 is a diagram illustrating a mutual calibration graph calculated by using measurement values obtained by a first thickness measurement method with length-unit traceability and a second thickness measurement method with offset traceability.

As an example, FIG. 5 illustrates an example in which after obtaining a first measurement value measured by using the HR-TEM and a second measurement value (intensity ratio) measured by using the MEIS for six samples in which ultra-thin films having different thicknesses of 5 nm or less are formed on Si (100) planes, a mutual calibration graph having a slope m and a y-intercept c is obtained by performing linear fitting of points [(x,y)=(second measurement value, first measurement value)] illustrated as square points for six samples and having the first measurement value as a y-axis value and the intensity ratio ($R_{MEIS}$) which is the second measurement value as an x-axis value.

Then, after obtaining a calibrated TEM thickness ($T^c_{TEM}=T_{TEM}-0.497$ nm) by subtracting the intercept c (=offset value) of the mutual calibration graph from the thickness ($T_{TEM}$) measured by using the HR-TEM, and obtaining a calibrated MEIS thickness ($T^c_{MEIS}=R_{MEIS}\times 3.065$ nm) by multiplying the intensity ratio ($R_{MEIS}=I_B/I_A$) by the slope (m=3.065) of the mutual calibration graph, a certificated thickness ($T_{cer}=(T^c_{TEM}+T^c_{MEIS})/2$) may be calculated from an average value of the calibrated TEM thickness ($T^c_{TEM}$) and the calibrated MEIS thickness ($T^c_{MEIS}$).

Here, uncertainty of measurement may be calculated by specific methods of the first thickness measurement method with length-unit traceability and the second thickness measurement method with offset traceability, and in a case where the first thickness measurement method is a method using the HR-TEM, HR-TEM measurement standard uncertainty may be expressed as $u^2_{TEM}=u^2_m+u^2_L+u^2_T$ ($u_m$: uncertainty by the finite number of times of measurement and A-type uncertainty calculated by dividing measurement standard deviation by a square root of the number of times of measurement, $u_L$: standard uncertainty when measuring inter-planar spacing of silicon (100), and $u_T$: standard uncertainty when determining positions of the interface and the surface). Further, in a case where the second thickness measurement method is a method using the MEIS, MEIS measurement standard uncertainty may be expressed as $u^2_{MEIS}=u^2_R$ ($u_R$: $R_{MEIS}$ measurement uncertainty and A-type uncertainty calculated by dividing measurement standard deviation by a square root of the number of times of measurement). Therefore, thin film thickness measurement uncertainty may be expressed as $u^2=u^2_{TEM}+u^2_{MEIS}$.

The method of calculating a thickness according to embodiments of the present invention is not significantly affected by the type of a specific material of the ultra-thin film. In a specific example, the material of the ultra-thin film may be an insulating material, a semiconductor material, or metal. The insulating material may be a high dielectric constant insulating film that is commonly used in a semiconductor device, such as an oxide (a composite oxide in a case of two or more), a nitride (a composite nitride in a case of two or more), or an oxynitride (a composite oxynitride in a case of two or more) of one or two or more elements selected from silicon, aluminum, magnesium, calcium, zirconium, hafnium, yttrium, strontium, lanthanum, tantalum, barium, and titanium, but the present invention is not limited thereto.

Embodiments of the present invention provide a graph type calibration standard used for calibration when calculating the thickness of the ultra-thin film having the nm-order thickness. The graph type calibration standard may include the mutual calibration graph.

The graph type calibration standard according to embodiments of the present invention may be based on measurement values obtained by measuring thicknesses of ultra-thin films having different thicknesses in reference samples including the ultra-thin films to be measured, the measurement values include the first measurement value using the first thickness measurement method with length-unit traceability and the second measurement value using the second thickness measurement method with offset traceability, and the graph type calibration standard may include a linear mutual calibration graph having a slope m and a y-intercept c, obtained by performing linear fitting of points having the first measurement value as a y-axis value and the second measurement value as an x-axis value. Advantageously, the first thickness measurement method may be a thickness measurement method using the HR-TEM, and the second thickness measurement method may be a thickness measurement method using the MEIS.

With the method of calculating a thickness according to embodiments of the present invention, it is possible to extremely accurately calculate a thickness of an ultra-thin film of 10 nm or less, specifically, 5 nm or less, which is advantageous.

With the method of calculating a thickness of an ultra-thin film according to embodiments of the present invention, it is possible to accurately measure an insulating film thickness of an electronic element including a gate insulating film, such as a metal-oxide-semiconductor field-effect transistor (MOSFET). Therefore, embodiments of the present invention provide a method of calculating a thickness of an insulating film of an electronic element, particularly, a thickness of a gate insulating film of an electronic element (electronic device) that uses single-crystal silicon as a channel material.

The method of calculating a thickness of an ultra-thin film according to embodiments of the present invention may be used for a quality control of a pre-manufactured electronic element or for manufacturing process management. For example, an intended thickness (design value) of a gate insulating film of an electronic element may be compared with a thickness (calculated value according to embodiments of the present invention) of a gate insulating film of an actually manufactured electronic element to sort out a defective product of which the thickness difference is out of an acceptable range and/or to control one or more process variables in a manufacturing process so that the thickness difference is to be within the acceptable range, wherein the thickness of the gate insulating film of the actually manufactured electronic element is measured by using the method of calculating a thickness of an ultra-thin film according to embodiments of the present invention.

The techniques described in connection with embodiments disclosed herein can be implemented or performed by a computing device having at least one processor, at least one memory and at least one communication interface. The elements of a method, process, or algorithm described in connection with embodiments disclosed herein can be embodied directly in hardware, in a software module executed by at least one processor, or in a combination of the two. Computer-executable instructions for implementing a method, process, or algorithm described in connection with embodiments disclosed herein can be stored in a non-transitory computer readable storage medium.

Hereinabove, although embodiments of the present invention have been described by specific matters, and drawings, they have been provided only for assisting in the entire understanding of the present invention. Therefore, the present invention is not limited to the embodiments. Various modifications and changes may be made by those skilled in the art to which the present invention pertains from this description.

Therefore, the spirit of the present invention should not be limited to the above-described embodiments, and the following claims as well as all modified equally or equivalently to the claims are intended to fall within the scopes and spirit of the invention.

What is claimed is:

1. A method of calculating a thickness of an ultra-thin film having a nm-order thickness, the method comprising:
    measuring a thickness of each of ultra-thin films having different thicknesses by using a first thickness measurement method with length-unit traceability to obtain a first measurement value, and separately measuring the thickness of each of the ultra-thin films having different thicknesses by using a second thickness measurement method with offset traceability to obtain a second measurement value;
    obtaining a mutual calibration graph having a slope m and a y-intercept c by performing linear fitting of points specified by the first measurement value and the second measurement value of each of the ultra-thin films having different thicknesses on a y axis representing a thickness obtained by the first thickness measurement method and an x axis representing a thickness obtained by the second thickness measurement method; and
    obtaining a first calibrated thickness by subtracting the y-intercept c from the first measurement value, obtaining a second calibrated thickness by multiplying the second measurement value by the slope m, and calculating an average value of the first calibrated thickness and the second calibrated thickness.

2. The method of claim 1, wherein the first thickness measurement method is a thickness measurement method using a high-resolution transmission electron microscope (HR-TEM), and the second thickness measurement method is a thickness measurement method using a medium energy ion scattering spectrometry (MEIS).

3. The method of claim 2, wherein the ultra-thin film is formed on a silicon single crystal substrate.

4. The method of claim 3, wherein when measuring the thickness by using the high-resolution transmission electron microscope, the thickness of the ultra-thin film is measured based on an inter-planar spacing of a silicon single crystal.

5. The method of claim 4, wherein when measuring the thickness by using the high-resolution transmission electron microscope, the first measurement value is calculated by obtaining contrast intensity distribution with respect to a virtual line that crosses from the silicon single crystal to the ultra-thin film while being perpendicular to a surface of the silicon single crystal substrate in a vertical cross-sectional high-resolution transmission electron microscope image of a layered body of the silicon single crystal substrate and the ultra-thin film, calculating an average contrast intensity of each of two regions forming boundaries in the contrast intensity distribution, and determining a central point of two average contrast intensities as a position of an interface between two regions, the first measurement value being the thickness of the ultra-thin film.

6. The method of claim 4, wherein when measuring the thickness by using the medium energy ion scattering spectrometry (MEIS), a ratio of thin film signal intensity/substrate signal intensity is calculated by obtaining the substrate signal intensity by integrating a signal intensity in a specific section of an energy interval corresponding to silicon in a medium energy ion scattering spectrum, and by obtaining the thin film signal intensity by integrating a signal intensity in the entire energy interval corresponding to component elements of the ultra-thin film in the same spectrum, the ratio being the second measurement value.

* * * * *